United States Patent
Gaskins et al.

(10) Patent No.: US 6,903,582 B2
(45) Date of Patent: Jun. 7, 2005

(54) INTEGRATED CIRCUIT TIMING DEBUG APPARATUS AND METHOD

(75) Inventors: Darius D. Gaskins, Austin, TX (US); James R. Lundberg, Austin, TX (US)

(73) Assignee: IP First, LLC, Fremont, CA (US)

( * ) Notice: Subject to any disclaimer, the term of this patent is extended or adjusted under 35 U.S.C. 154(b) by 0 days.

(21) Appl. No.: 10/682,351

(22) Filed: Oct. 9, 2003

(65) Prior Publication Data

US 2004/0113668 A1 Jun. 17, 2004

Related U.S. Application Data

(60) Provisional application No. 60/433,537, filed on Dec. 13, 2002.

(51) Int. Cl.[7] .................................................. H03L 7/00
(52) U.S. Cl. ........................................ 327/141; 714/731
(58) Field of Search ................................ 327/141, 147, 327/156; 714/700, 703, 731; 375/373, 375, 376

(56) References Cited

U.S. PATENT DOCUMENTS

| | | | |
|---|---|---|---|
| 5,239,206 A | 8/1993 | Yanai | ........................ 327/202 |
| 5,809,034 A * | 9/1998 | Rezvani et al. | ............. 714/700 |
| 6,192,092 B1 | 2/2001 | Dizon et al. | ................. 375/371 |
| 6,289,068 B1 * | 9/2001 | Hassoun et al. | ............ 375/376 |
| 6,647,081 B2 * | 11/2003 | Butler et al. | ................ 375/376 |

* cited by examiner

*Primary Examiner*—Linh My Nguyen
(74) *Attorney, Agent, or Firm*—Richard K. Huffman; Gary Stanford; James W. Huffman

(57) ABSTRACT

A timing debug tool for an IC that enables varying the skew of selected edges of a primary clock signal for a controllable number of clock cycles. The debug tool enables identification, isolation and analysis of timing problems on the IC. An IC including programmable clock skew logic that applies a programmed skew amount to selected edges of a clock signal. A debug system including clock control logic further including a delay block and test logic. The delay block delays a selected number of transitions of a first clock signal to provide a second clock signal, where each selected transition of the second clock signal is delayed, based on a sync signal, by either one of a default skew amount and a programmed skew amount. The test logic enables dynamic control of the sync signal and dynamic programming of the selected skew amount.

24 Claims, 10 Drawing Sheets

INTEGRATED CIRCUIT TIMING DEBUG APPARATUS AND METHOD

CROSS-REFERENCE TO RELATED APPLICATIONS

This application claims the benefit of U.S. Provisional Application No. 60/433,537, filed on Dec. 13, 2002, which is herein incorporated by reference in its entirety for all intents and purposes.

This application is related to the following co-pending U.S. patent application, which is filed on the same day as this application, which has a common assignee and at least one common inventor, and which is herein incorporated by reference in its entirety for all intents and purposes:

| SERIAL NUMBER | DOCKET NUMBER | TITLE |
| --- | --- | --- |
| 10/682,351 | CNTR.2114 | METHOD AND APPARATUS FOR FINE TUNING CLOCK SIGNALS OF AN INTEGRATED CIRCUIT |

BACKGROUND OF THE INVENTION

1. Field of the Invention

The present invention relates to analyzing and resolving timing issues on an integrated circuit, and more particularly to an integrated circuit timing debug apparatus and method for dynamically changing the skew of a core clock signal on an integrated circuit for a controllable number of clock cycles to facilitate isolation and analysis of data hold/setup timing problems.

2. Description of the Related Art

Integrated circuit designers have employed simulation and/or test to identify, isolate, and analyze timing problems on a chip, which often resulted in a chip design that at best could not perform at target clock speeds and that at worst had to be modified prior to mass fabrication. Typically, register logic within each logic block of the chip is employed to transmit/receive data to/from a succeeding/preceding logic stage. Setup time problems occur when a given logic block exhibits a critical delay path with regard to operations performed within to the extent that, at a given clock speed, valid data is not provided to the next logic stage until after a clock edge occurs at the next logic stage that is intended to latch the data. A hold time problem is exhibited by a logic chain when the given logic block provides valid data to the next logic block but the data becomes invalid prior to a clock edge occurring at the next logic block that is intended to latch the data. In the setup time problem case, the latching clock edge at the next logic stage occurs too soon for the transfer of valid data. In the hold time problem case, the latching clock edge at the next logic stage occurs too late for the transfer of valid data.

FIG. 1A is a simplified block diagram showing a circuit 100 with two representative successive logic blocks 101 and 103 to which clock signals are provided. The first logic block 101 (LOGIC BLOCK 1) receives a first clock signal ELCK1 and provides data signals DATA to the second logic block 103 (LOGIC BLOCK 2), which receives a second clock signal ECLK2. FIG. 1B is a timing diagram illustrating operation of the circuit 100 for synchronized versus skewed clock signals. The timing diagram generally shows traces of the ELCK1, ECLK2 and DATA signals versus time. Particular time points are shown, including times T1, T2, T3, T4, and T5 occurring in sequential order.

The first two traces of the timing diagram show the case when the ECLK1 and ECLK2 clock signals are synchronized illustrating a setup time problem. As shown, for example, the ECLK1 and ECLK2 signals have synchronous edges including substantially coincident falling edges at time T1 and substantially coincident rising edges at time T3. The third trace shows the relative timing of the DATA signals from the first logic block 101 in which the DATA signals switch and become valid at a time T4, which is after time T3. The synchronized clock case illustrates a setup time problem in which the first logic block 101 exhibits a critical delay path such that valid data on the DATA signals at time T4 is not provided to the logic block 103 until after the rising clock edge at time T3 occurs. Because there is more work delay in the logic block 101 than there is time in a clock cycle, upon the rising edge of ECLK2 at time T3, invalid data is clocked into the logic block 103.

The fourth and fifth traces of the timing diagram show the case when the ECLK2 signal is skewed relative to the ECLK1 signal. In particular, the fourth trace is a trace of the ECLK1 signal substantially similar to the first trace of ECLK1. The fifth trace shows ECLK2 skewed relative to ECLK1 where the falling edge of ECLK2 occurs at time T2 after time T1 and the subsequent rising edge of ECLK2 occurs at a time T5 after the time T4. The skewed clocks case illustrates that by delaying ECLK2 relative to ECLK1, the setup time problem is eliminated. In particular, the rising edge of ECLK2 is delayed until after the DATA signals become valid, thus allowing a valid transfer of data from the first logic block 101 to the second logic block 103.

Designers have heretofore provided hardwired logic, such as fuses and one-time programmable logic devices, to skew the clocks that are provided to sequential logic blocks to solve critical path and hold time problems. Such solutions provided a clock skew fix that could not be changed after implementation without modifying the chip design. Also, with reference to the illustrated example, one of ordinary skill in the art will appreciate that ECLK2 can be delayed only in the event that there is delay margin associated with the second logic block 103. An alternative solution is to advance the clock for latching incoming data into the preceding logic block (e.g., logic block 101) so that more time is provided for the stage to perform its work. This alternative solution is not always feasible, however, and may result in new and unforeseen timing problems.

If the setup and hold problems described above occur, but not during every clock cycle, then identification and isolation of problem areas can be very complex indeed. Microprocessors, for example, are very much the types of pipelined systems where problems like this may be exhibited as a function of the flow of instructions that are executed. It is not inconceivable that a timing problem could occur on a single clock cycle well after initialization of the microprocessor. Yet a single timing error of this nature can cause failure of microprocessor operation. Skewing all cycles of a pipeline clock would be insufficient to identify and isolate timing problems that do not occur every clock cycle. In fact, skewing all cycles of a pipeline clock could potentially mask over periodic or one-time setup and hold problems.

As a matter of practice, designers analyze and simulate complex logic paths in an integrated circuit prior to committing a design to production. But one skilled in the art will appreciate that slight differences in clock skew cannot be simulated with sufficient accuracy and production process variations furthermore cannot be precisely modeled. Hence, fabricated integrated circuits often exhibit a number of unanticipated critical timing paths that designers are forced to address prior to shipment. Consequently, any setup time problems that occur after-the-fact (i.e., after the chip is fabricated and clock skews have been established) can only be eliminated by slowing down the clock speed of the device. Worse yet, after-the-fact hold time problems render a design totally inoperative. In either case, significant design modifications (often including changes to masks, electron beam analysis, etc.) are required to fix these types of problems.

SUMMARY OF THE INVENTION

An integrated circuit (IC) timing debug apparatus and method according to the present invention enables varying the skew of selected edges of a primary clock signal for a controllable number of clock cycles. Such apparatus and method enables identification, isolation and analysis of setup and hold timing problems on the IC, including problems that are isolated or that occur only during single clock edges. Once a timing problem is determined, the IC may be programmed to correct the timing problem to enable the chip to be operated at target clock speeds. The IC programming may be implemented in any desired manner, such as by blowing fuses or programming an Erasable Programmable Read-Only Memory (EPROM) or any other programming method to adjust skew of one or more local clock signals.

An IC according to an embodiment of the present invention includes programmable clock skew logic, an external interface and test logic. The programmable clock skew logic applies a programmed skew amount to edges of a clock signal selected by a sync signal. The test logic enables programming of the programmed skew amount and control of the sync signal. Many variations of how the test logic operates are contemplated. In one embodiment, the test logic executes a debug routine that programs the clock skew logic and that controls the sync signal. Alternatively, the test logic enables access to the clock skew logic by an externally-coupled chip tester via the external interface for programming skew and for controlling the sync signal.

Many implementation variations of the IC are contemplated. In one embodiment, the IC may further include a clock generator that synchronizes a primary clock signal with a feedback clock signal, a clock distribution network that distributes duplicates of the skewed primary clock signal on the IC, and a clock phase synchronization node that receives the duplicate skewed clock signals and that returns a core clock signal. In one embodiment, the clock skew logic may include a first clock skew logic block and a second clock skew logic block. The first clock skew logic block receives a first sync signal and skews the primary clock signal to provide a skewed primary clock signal. The second clock skew logic block receives a second sync signal and the core clock signal and provides the feedback clock signal with compensated skew. The test logic provides the first sync signal to correspond to the primary clock signal and the second sync signal to correspond to the core clock signal.

Each clock skew logic block may be implemented in any suitable manner for skewing a clock signal. In one embodiment, the clock skew logic includes programmable phase adjust logic and a clock skew buffer. The phase adjust logic receives a sync signal and provides a set of delay bits indicative of a programmed skew amount. The clock skew buffer receives the set of delay bits and delays an input clock signal by an amount determined by the set of delay bits. The phase adjust logic may include a programmable memory for storing the programmed skew value.

The clock skew logic may further include first and second clock skew buffers and select logic. The phase adjust logic provides a first set of delay bits to the first buffer and a second set of delay bits indicative of a default skew value to the second buffer. The buffers provide first and second skewed clock signals, respectively, to inputs of the select logic, where the second skewed clock signal delays the input clock signal by a default skew amount. The phase adjust logic provides a select signal, controlled by the sync signal, to the select input of the select logic. In one embodiment, phase adjust logic of a first clock skew logic block is programmed with a first skew value, phase adjust logic of a second clock skew logic block is programmed with a second skew value. The second skew value provides an equal and opposite skew amount of the first skew value relative to the default skew amount.

A debug system for varying clock skew of an IC for a controllable number of clock cycles according to an embodiment of the present invention includes clock control logic integrated on the IC and a chip tester. The clock control logic includes a delay block and test logic. The delay block delays a selected number of transitions of a first clock signal to provide a second clock signal, where each selected transition of the second clock signal is delayed, based on a first sync signal, by either one of a default skew amount and a selected skew amount. The test logic enables dynamic control of the first sync signal and dynamic programming of the selected skew amount. The chip tester is coupled to the test logic via an external test port, where the chip tester provides the selected skew amount and controls the first sync signal.

The clock control logic of the debug system may further include a clock generator that synchronizes the first clock signal with a feedback clock signal, a clock distribution network that distributes one or more third clock signals based on the second clock signal, a clock phase synchronization node that receives the third clock signal(s) and that returns a core clock signal, and a compensation delay block that delays transitions of the core clock signal corresponding to the selected transitions of the first clock signal to provide the feedback clock signal. Each selected transition of the core clock signal is delayed, as determined by a second sync signal, by either one of the default skew amount and a compensated skew amount. The test logic provides the first sync signal corresponding to the first clock signal and the second sync signal corresponding to the core clock signal. In one embodiment, the compensated skew amount is an opposite differential of the selected skew amount relative to the default skew amount.

A method of debugging an IC by adjusting skew of a primary clock signal for a controllable number of clock cycles according to an embodiment of the present invention includes providing at least one skew value to the IC, selecting at least one edge of the primary clock signal, and delaying a selected number of edges of the primary clock signal according to the at least one skew value.

The method may further include executing a debug routine that provides one or more skew values and that controls assertion of one or more sync signals to select edges of the primary clock signal. The method may further include programming on-chip test logic with the debug routine. The method may further include coupling an external chip tester to the IC via a test interface coupled to on-chip test logic and executing the debug routine on the chip tester to control the IC.

The method may further include advancing or delaying selected edges of the primary clock signal relative to a default skew amount, synchronizing the primary clock signal with a feedback clock signal, distributing a plurality of skewed primary clock signals on the IC to a clock phase synchronization node, which returns a core clock signal, and compensating skew of edges of the core clock signal corresponding to the selected edges of primary clock signal relative to the default skew amount to provide the feedback clock signal. The compensating skew of edges of the core clock signal may include adjusting the edges by an equal and opposite amount relative to the default skew amount.

The method may further include programming a first skew value and a second skew value on the IC, delaying a selected number of edges of the primary clock signal by a skew amount based on the first skew value, and delaying edges by a skew amount based on the second skew value. The compensating skew may include phase adjusting the first and second skew values to provide equal and opposite skew amounts relative to the default skew amount.

BRIEF DESCRIPTION OF THE DRAWINGS

The benefits, features, and advantages of the present invention will become better understood with regard to the following description, and accompanying drawings where.

DETAILED DESCRIPTION

The following description is presented to enable one of ordinary skill in the art to make and use the present invention as provided within the context of a particular application and its requirements. Various modifications to the preferred embodiment will, however, be apparent to one skilled in the art, and the general principles defined herein may be applied to other embodiments. Therefore, the present invention is not intended to be limited to the particular embodiments shown and described herein, but is to be accorded the widest scope consistent with the principles and novel features herein disclosed.

The inventors of the present application have recognized the need for providing integrated circuit (IC) designers a timing debug tool to identify, isolate and analyze timing problems on a chip. They have therefore developed an IC timing debug apparatus and method for varying the skew of a core clock signal for a controllable number of clock cycles on an IC for identifying, isolating and analyzing data setup and hold timing problems, as will be further described below with respect to FIGS. 2–10.

Figure 1A:
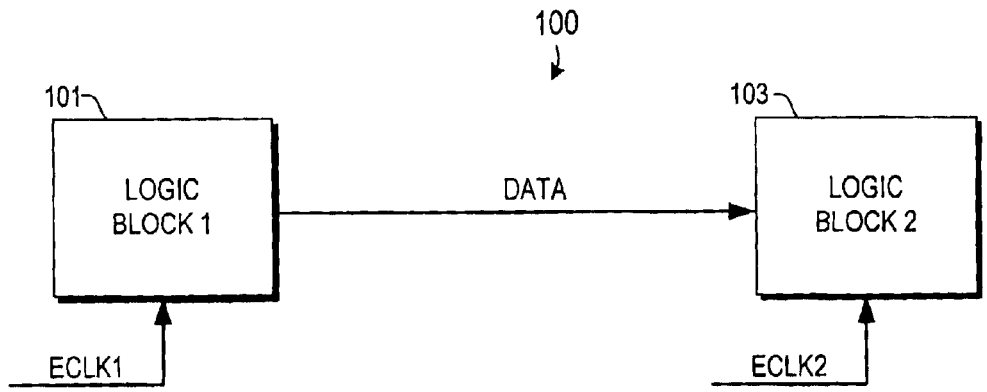
FIG. 1A is a simplified block diagram showing a circuit with two representative successive logic blocks and to which corresponding clock signals are provided.
Figure 1B:
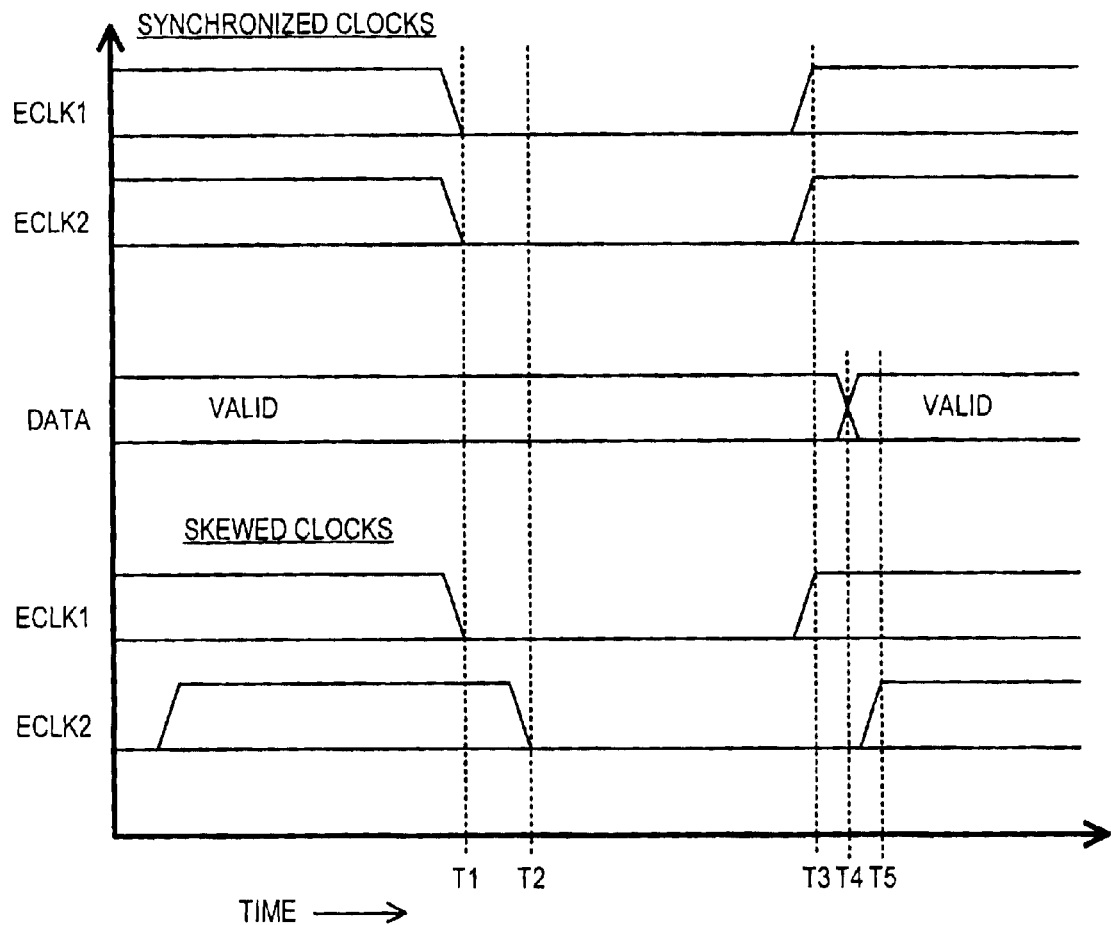
FIG. 1B is a timing diagram illustrating operation of the circuit of FIG. 1A for synchronized versus skewed clock signals.
Figure 2:
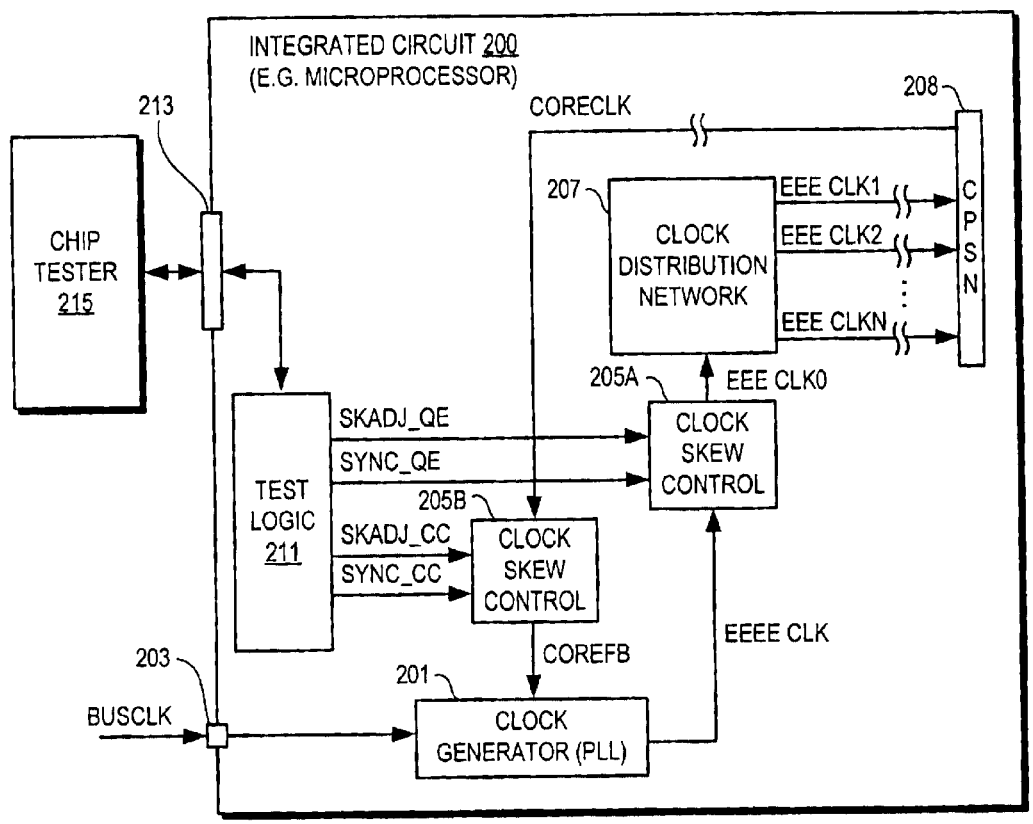
FIG. 2 is a block diagram of an integrated circuit incorporating a timing debug system according to an exemplary embodiment of the present invention.

FIG. 2 is a block diagram of an integrated circuit (IC) 200 incorporating a timing debug system according to an exemplary embodiment of the present invention. In the exemplary embodiment illustrated, the IC 200 is a microprocessor, although it is understood that the present invention applies to any type of circuitry or function fabricated onto a chip. A BUSCLK signal is provided from an external source (not shown) to a clock generator 201 within the IC 200 via a clock input pin 203. The clock generator 201 uses the BUSCLK signal and generates a "quad-E" or EEEE CLK signal, which is provided to on-chip clock control logic including clock skew control logic 205A. The EEEE CLK signal is the primary clock signal used to derive the clock signals to be distributed around the IC 200. The clock skew control logic 205A generates a corresponding preliminary EEE CKL0 signal, which is provided to a clock distribution network 207. The clock distribution network 207 provides multiple distributed copies or versions of the EEE CLK0 signal, individually shown as signals EEE CLK1, EEE CLK2, . . . , EEE CLKN, where "N" is a positive integer greater than 0. The distributed EEE CLK signals are skewed versions of the primary EEEE CLK signal, which are provided to logic blocks (not shown) incorporated on and distributed throughout the IC 200, generally performing the major logic functions of the device implemented on the IC 200.

The final leg of the clock distribution chain of the EEE CLK signals is routed back from a clock phase synchronization node (CPSN) 208 on the IC 200 in the form of a core clock signal CORECLK, which, as further described below, is converted for synchronization compensation to a feedback clock signal COREFB provided to the clock generator 201. The clock generator 201 is configured with a phase-locked loop (PLL) circuit which operates to synchronize the frequency and duty cycle between the EEEE CLK signal and the COREFB signal, as known to those of ordinary skill in the art. In accordance with an embodiment of the present invention, the return CORECLK signal is provided to the clock control logic including clock skew control logic 205B, which generates the COREFB signal as a skewed version of the CORECLK signal.

The IC 200 includes on-chip test logic 211, which provides skew control signals to the clock skew control logic blocks 205A and 205B to vary the amount of skew to be applied to a controllable number of clock cycles, meaning selected clock edges or clock transitions. In particular, the test logic 211 provides a skew adjust signal SKADJ_QE to the clock skew control logic 205A, which determines the relative skew amount to be applied to selected edges of each of the EEE CLK signals relative to the EEEE CLK signal. The test logic 211 asserts or otherwise pulses a synchronization signal SYNC_QE to the clock skew control logic 205A to corresponding to or otherwise coincident with one or more of the clock edges of the EEEE signal to which the programmed skew amount is to be applied.

In a similar manner, the test logic 211 provides another skew adjust signal SKADJ_CC to the clock skew control logic 205B, which determines the relative skew amount to be applied to selected edges of the COREFB signal. The test logic 211 asserts another synchronization signal SYNC_CC to the clock skew control logic 205B to correspond to or otherwise coincident with one or more of the clock edges of the CORECLK signal to which the programmed skew amount is to be applied. As described further below, the clock skew control logic 205B may be programmed to provide an equal and opposite skew amount as provided by the programmed skew value of the clock skew control logic 205A relative to a default skew amount to edges of the CORECLK signal corresponding to selected edges of the EEE CLK0 signal to compensate relative timing between the EEEE CLK and COREFB signals.

The test logic 211 is externally accessible via an external interface or external test port 213 provided on the IC 200. The test port 213 may include any number of external pins of the IC 200, which may be dedicated test pins or dual purpose pins as known to those of ordinary skill in the art. A chip tester 215 is coupled to the IC 200 via the test port 213, which provides a communication interface between the chip tester 215 and the test logic 211. The test logic 211 and the test port 213 may be implemented according to the JTAG (Joint Test Action Group) in which the test logic 211 comprises JTAG logic and the test port 213 comprises a JTAG port. In a standard test configuration, the chip tester 215 includes a socket or the like (not shown) for receiving the IC 200. The chip tester 215 is able to control the external pins of the IC 200, including all the pins of the test port 213. In a typical JTAG configuration, for example, the chip tester 215 powers up the IC 200 and holds it in reset while configuring the IC 200 for test. During the test configuration while the IC 200 is held in reset, the chip tester 215 is able to access the test logic 211 via the test port 213, and set values or bits in selected registers or even load test data and/or one or more test or debug routines for test and debug purposes. The chip tester 215 then pulls the IC 200 out of reset and monitors and controls operation of the IC 200.

In one embodiment, the chip tester 215 programs the clock skew control logic blocks 205A and 205B via the test logic 211 with corresponding skew adjustment values during test and/or the reset condition. Digital skew values are asserted on each of the SKADJ_QE and SKADJ_CC signal lines to program the clock skew control logic blocks 205A and 205B, respectively. In one embodiment, the SKADJ_QE and SKADJ_CC signals each include a single signal line in which the digital skew values are provided as a serial bit stream. Alternatively, the SKADJ_QE and SKADJ_CC signals each include multiple signal lines in which the digital skew values are provided in a parallel format. Any suitable programming technique may be employed for programming the clock skew control logic blocks 205A and 205B with corresponding skew values, such as using other control signals (not shown) or by toggling the corresponding SKADJ_X signals with a predetermined programming pattern.

Once the skew values are programmed into the clock skew control logic blocks 205A and 205B, the test logic 211 asserts the SYNC_QE and SYNC_CC signals coincident with selected clock signal edges to be skewed or advanced relative to the default skew amount. In one embodiment, the test logic 211 is programmed with a test/debug routine that identifies one or more selected clock signal edges and that asserts the SYNC_QE and SYNC_CC signals corresponding with the selected clock signal edges. Alternatively, the debug routine is located within the chip tester 215, which controls the test logic 211 to assert the SYNC_QE and SYNC_CC signals at the appropriate times. In yet another embodiment, the skew values may be programmed "on the fly" or while the debug routine is running. For example, the chip tester 215 programs the test logic 211 during reset with the debug routine, and the reset condition is removed to enable operation of the debug routine. During operation, the debug routine is configured to program the clock skew control logic blocks 205A and 205B as many number of times as desired depending upon which clock signals edges are to be tested. For each programmed skew, the debug routine is programmed to assert the SYNC_QE and SYNC_CC signals at the appropriate times coincident with selected clock edges to be skewed or advanced. The test logic 211 may store the results of test or the results may be dynamically monitored by the chip tester 215.

Figure 3:
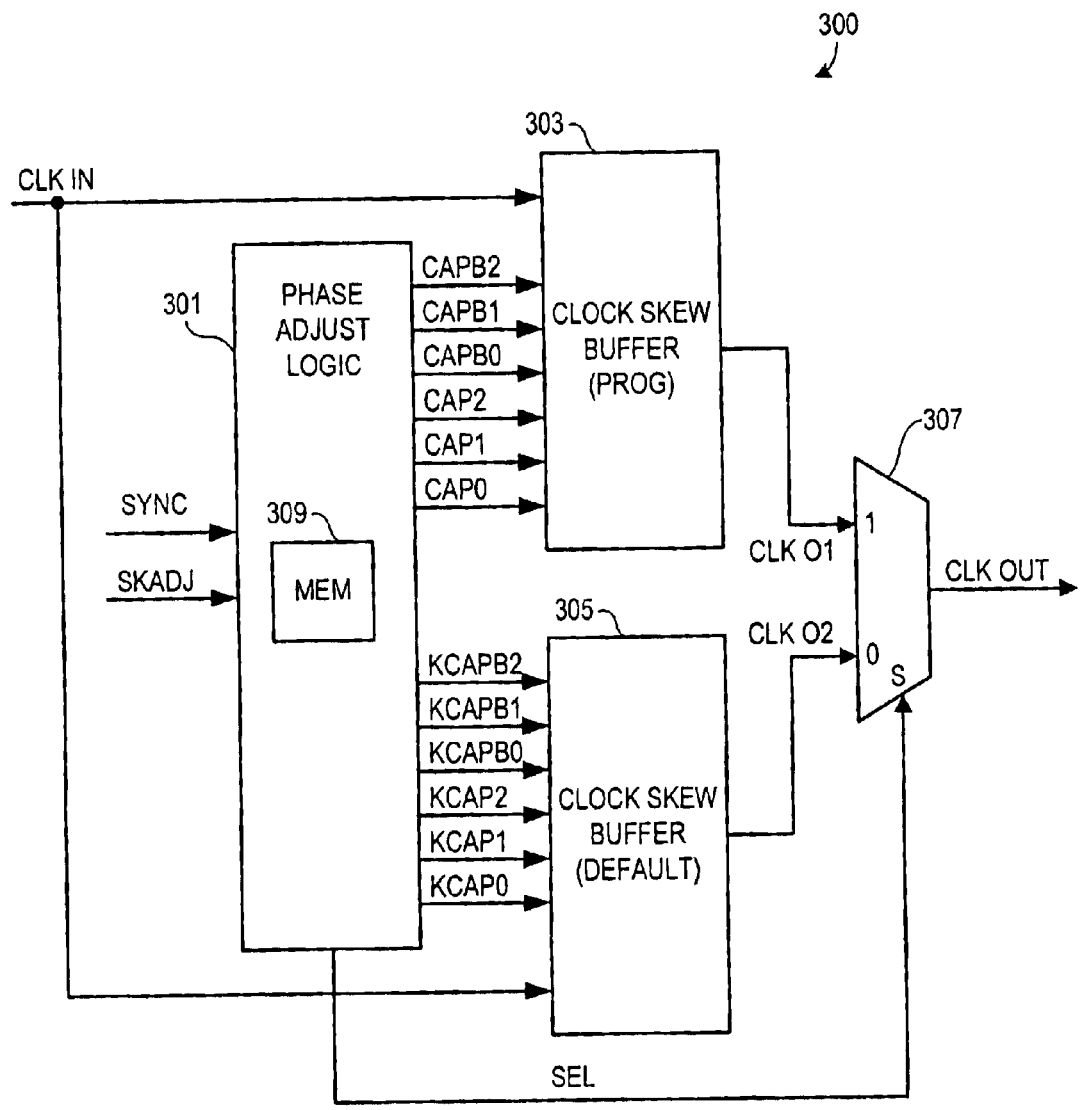
FIG. 3 is a more detailed block diagram of an exemplary embodiment of the clock skew control logic blocks of FIG. 2.

FIG. 3 is a more detailed block diagram of an exemplary embodiment of clock skew control logic 300, which may be used for either or both of the clock skew control logic blocks 205A and 205B. A pair of signals SYNC and SKADJ are provided to respective inputs of phase adjust logic 301, which provides a first set of delay bits CAP[M:0]/CAPB[M:0] to corresponding inputs of a first clock skew buffer 303, and further provides a second set of delay bits KCAP[M:0]/KCAPB[M:0] to corresponding inputs of a second clock skew buffer 305. The number "M" is a positive integer in which (M+1) is equal to half the number of bits of the set of delay bits. In the embodiment shown, each set of delay bits includes 3 true bits CAP0, CAP1 and CAP2 (first set) and KCAP0, KCAP1 and KCAP3 (second set) and a corresponding 3 complementary bits CAPB0, CAPB1 and CAPB2 (first set) and KCAPB0, KCAPB1 and KCAPB3 (second set), where M=2. A "B" appended in the signal name denotes the complementary logic bit. An input clock signal CLK IN is provided to another input of each of the clock skew buffers 303 and 305, which provide respective output clock signals CLK 01 and CLK 02. The CLK 01 signal is provided to a first or logic "1" input of a multiplexer (MUX) 307 and the CLK 02 signal is provided to a second or logic "0" input of the MUX 307. The phase adjust logic 301 provides a select signal SEL to the select input of the MUX 307. The output of the MUX 307 provides an output clock signal CLK OUT. For the clock skew control logic 205A, the CLK IN, SYNC, SKADJ and CLK OUT signals are coupled to the EEEE CLK, SYNC_QE, SKADJ_QE and EEE CLK0 signals, respectively. For the clock skew control logic 205B, the CLK IN, SYNC, SKADJ and CLK OUT signals are coupled to the CORECLK, SYNC_CC, SKADJ_CC and COREFB signals, respectively.

The clock skew buffers 303 and 305 are each implemented in a substantially identical manner in the embodiment shown, so that the skews of the CLK 01 and CLK 02 signals relative to the CLK IN signal are controlled by the first and second sets of delay bit inputs, respectively. The first set of delay bits CAP[M:0]/CAPB[M:0] asserted by the phase adjust logic 301 enables the amount of skew applied by the clock skew buffer 303 to the CLK OUT signal relative to the CLK IN signal to be adjusted relative to a default skew amount provided by the second set of delay bits KCAP[M:0]/KCAPB[M:0]. In the embodiment shown, since each set of delay bits includes 3 true bits and 3 complementary bits, there are a total of eight different skew values, namely 000b, 001b, 010, . . . , 111b, where a lower-case "b" appended to a number indicates the binary notation. As described more fully below, a relatively constant delay increment or delay unit is added for each binary increment of the set of delay bits ranging from relatively little or no delay for 000b, to a maximum delay for 111b.

The second set of delay bits KCAP[M:0]/KCAPB[M:0] is set or otherwise hardwired to a default skew value 100b so that the CLK OUT signal is delayed relative to the CLK IN signal by a default skew amount if the "0" input of the MUX 307 is selected. When the "1" input of the MUX 307 is selected, the first set of delay bits CAP[M:0]/CAPB[M:0] is programmed to further delay the CLK OUT signal relative to the default skew amount if programmed to a value greater than 100b, or to effectively advance the CLK OUT signal relative to the default skew amount if programmed to a value less than 100b.

In the embodiment shown, the phase adjust logic 301 includes a programmable memory 309 or any type of logic device that is capable of storing the programmed skew value. The phase adjust logic 301 asserts the delay bits CAP[M:0]/CAPB[M:0] according to a programmed skew value stored in the memory 309. In one embodiment, the skew value is a 3-bit encoded value stored in the memory 309 and used by the phase adjust logic 301 to derive the delay bits CAP[M:0]/CAPB[M:0]. For example, for a programmed skew value of 011b indicative of 3 delay units, the CAP[M:0] bits are equal to 011b and the CAPB[M:0] bits are equal to 100b. The phase adjust logic 301 asserts the default delay bits KCAP[M:0]/KCAPB[M:0] according to a predetermined default skew value, such as 100b corresponding to 4 delay units. In this manner, the phase adjust logic 301 is programmed with a skew value greater than 100b to skew or delay one or more selected clock edges of the CLK IN signal relative to the default skew value, and is programmed with a skew value less than 100b to advance one or more selected clock edges relative to the default skew value.

In the embodiment shown, the SYNC signal operates as a strobe signal to toggle the SEL signal. Thus, if the SEL signal is low or logic zero (0) and the SYNC signal is pulsed, the SEL signal goes high or logic one (1). When the SYNC signal is pulsed again, the SEL signal goes low again. When the SEL signal is low, the "0" input of the MUX 307 is selected so that the CLK OUT signal is delayed relative to the CLK IN signal by the default skew amount. When the SEL signal is high, the "1" input of the MUX 307 is selected so that the CLK OUT signal is delayed relative to the CLK IN signal by the programmed skew amount stored in the memory 309. In the illustrated embodiment, therefore, the SYNC signal is strobed or pulsed just prior to a first rising or falling edge of the CLK IN signal to skew or advance a series of one or more edges by the programmed amount, and then the SYNC signal is pulsed again just after the last edge in the series to return to the default skew amount. Of course, the "series" of edges may be a single isolated edge.

Many alternative implementations are contemplated for the clock skew control block 300. In one variation, the MUX 307 and the clock skew buffer 305 are removed and the phase adjust logic 301 is modified to toggle the CAP[M:0]/CAPB[M:0] bits between the default value and the programmed value. In this case, the output of the clock skew buffer 303 directly asserts the CLK OUT signal. In another auto-reset variation, the phase adjust logic 301 receives the CLK IN signal and automatically toggles the SEL signal back to the default case after the next edge of the CLK IN signal. In the auto-reset case, the SYNC signal is pulsed just prior to the target edge so that the phase adjust logic 301 asserts the SEL signal high to delay or advance the edge by the programmed amount. Then, the phase adjust logic 301 automatically returns the SEL signal back low after the edge to continue normal operation. In another variation, the SYNC signal is level sensitive rather than pulse-triggered, so that the SEL signal is low when SYNC is low and the SEL signal is high when SYNC is high. In this case, the SEL signal and its associated logic can be removed and the SYNC signal used directly to control the select input of the MUX 307. Of course, many other variations are possible as known to those of ordinary skill in the art.

Figure 4:
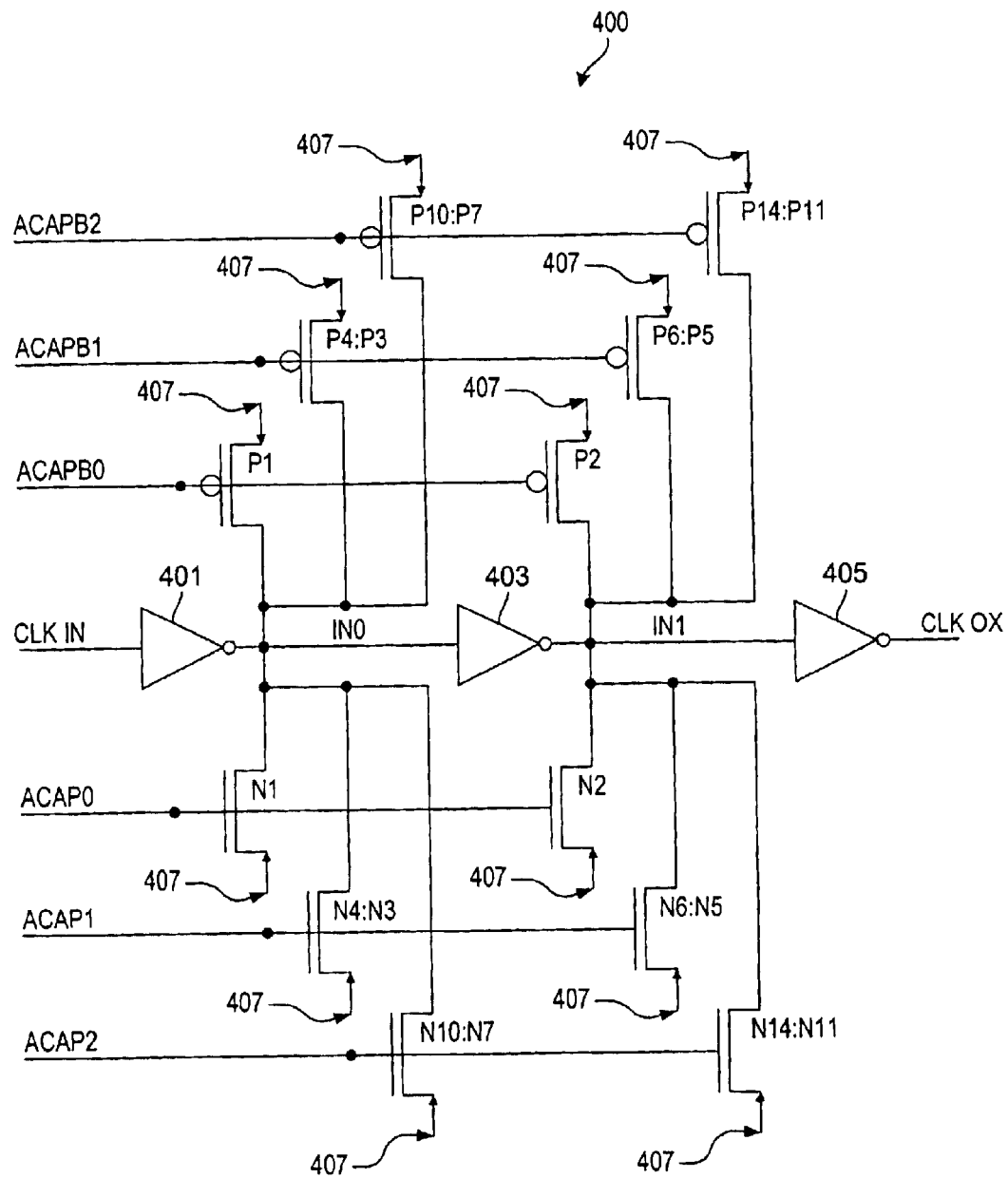
FIG. 4 is a schematic diagram of an exemplary embodiment of a clock skew buffer, which is used to implement the clock skew buffers of FIG. 3.

FIG. 4 is a schematic diagram of an exemplary embodiment of a clock skew buffer 400, which is used to implement the clock skew buffers 303 and 305 in the embodiment shown. The CLK IN signal is provided to the input of an inverter/buffer 401, which asserts a signal IN0 at its output to the input of another inverter/buffer 403. The inverter/buffer 403 asserts a signal IN1 at its output, which is coupled to the input of another inverter/buffer 405. The inverter/buffer 405 asserts an output clock signal CLK 0X signal at its output, which is the CLK 01 signal for the clock skew buffer 303 and the CLK 02 signal for the clock skew buffer 305. It is noted that the CLK 0X signal is inverted relative to the corresponding CLK IN signal given an odd number of inverters in the embodiment shown. An additional inverter/buffer (not shown) may be used to invert the clock signal again, or any of the inverter/buffers 401, 403, or 405 may be configured as a buffer if desired.

The clock skew buffer 400 includes a set of input noders ACAP [2:0]/ACAPB[2:0], which are coupled to receive the set of delay bits CAP[M:0]/CAPB[M:0] for the clock skew buffer 303, or which are coupled to receive the set of delay bits KCAP[M:0]/KCAPB[M:0] for the clock skew buffer 305. The ACAP0 node is coupled to the gates of two N-channel devices N1 and N2 and the ACAPB0 node is coupled to the gates of two P-channel devices P1 and P2. The ACAP1 node is coupled to the gates of a pair of N-channel devices N3 and N4 (shown collectively as N4:N3) and to the gates of another pair of N-channel devices N5 and N6 (shown collectively as N6:N5). The ACAPB1 node is provided to the gates of a pair of P-channel devices P3 and P4 (shown collectively as P4:P3) and to the gates of another pair of P-channel devices P5 and P6 (shown collectively as P6:P5). The ACAP2 node is coupled to the gates of an array of four N-channel devices N7, N8, N9 and N10 (shown collectively as N10:N7) and to the gates of another array of four N-channel devices N11, N12, N13 and N14 (shown collectively as N14:N11). The CAPB2 node is coupled to the gates of an array of four P-channel devices P7, P8, P9 and P10 (shown collectively as P10:P7) and to the gates of another array of four P-channel devices P11, P12, P13 and P14 (shown collectively as P14:P11).

The drains of the N-channel devices N1, N3, N4 and N7–N10 and drains of the P-channel devices P1, P3, P4 and P7–P10 are all coupled to the output of the inverter/buffer 401. The drains of the N-channel devices N2, N5, N6, and N11–N14 and drains of the P-channel devices P2, P5, P6, and P11–P14 are all coupled to the output of the inverter/buffer 403. The sources of all of the N-channel devices N1–N14 and the P-channel devices P1–P14, indicated by reference numeral 407, are floated (floating sources) so that the output of the inverter/buffers 401, 403 see the channel and source capacitances of each of the devices coupled thereto during signal transitions.

The exemplary local clock buffer 400 is implemented using sequentially-coupled buffers with one or more intermediate nodes, and binarily-distributed N-channel and P-channel arrays coupled to one or more of the intermediate nodes to effectuate a digitally controlled skew. In particular, the N-channel devices N1, N4:N3 and N10:N7 form a binarily-distributed N-channel array and the P-channel devices P1, P4:P3 and P10:P7 form a corresponding complementary and binarily-distributed P-channel array. In a similar manner, the N-channel devices N2, N6:N5 and N14:N11 form another binarily-distributed N-channel array and the P-channel devices P2, P6:P5 and P14:P11 form another corresponding complementary and binarily-distributed P-channel array. In the embodiment shown, two stages of delay are provided from the CLK IN signal to the CLK 0X signal to compensate for different turn on and turn off characteristics of P- and N-channel devices. For example, the N-channel device turn off characteristics in the second stage (IN0 to IN1) compensate for the P-device turn on characteristics in the first stage (CLK IN to IN0). The particular configuration of each of the clock buffers is exemplary only and any other type of digitally programmable delay logic known to those of ordinary skill in the art is contemplated.

The ACAP0/ACAPB0 nodes control one set of N- and P-channel devices (N1/P1 and N2/P2), the ACAP1/ACAPB1 nodes control two arrayed sets of like N and P devices (N4:N3/P4:P3 and N6:N5/P6:P5), and the ACAP2/ACAPB2 nodes control four arrayed sets of N and P devices (N10:N7/P10:P7 and N14:N11/P14:P11). In this manner, asserting the ACAP2 node results in a delay of the CLK IN signal that is four times that exhibited by asserting the ACAP0 node. In one embodiment, each of the P- and N-channel device pairs are matched to provide substantially the same resistive/capacitive (RC) characteristics, resulting in a relatively constant delay unit for each asserted increment of the 3-bit encoded signal. In an exemplary embodiment, each delay unit is approximately 6 picoseconds (ps). Thus, when the ACAP0 node is asserted high (logic 1) while the ACAPB0 node is asserted low (logic 0), a 6 ps delay is added between the CLK IN signal and the CLK OUT signal. In a similar manner, when the ACAP1 node is asserted high while the ACAPB1 node is asserted low, a 12 ps delay is added, and when the ACAP2 node is asserted high while the ACAPB2 node is asserted low, a 24 ps delay is added. For example, a value of ACAP2:ACAP0= 011b equates to an overall clock delay of approximately 18 ps through the local clock buffer 303. In summary, a delay from 0 to 48 ps may be added in 6 ps units using the 3-bit delay ACAP2:ACAP0 nodes. One skilled in the art will appreciate that asserting the ACAPx and ACAPBx signals results in delay as has heretofore been described due to the formation of channel-to-gate capacitances that are seen by the gates of corresponding devices when their associated ACAPx and ACAPBx signals are asserted. For example, an N-channel device sees a channel-to-gate capacitance because, when its gate is high, an inversion channel forms from its drain to its source, thus forming the channel-to-gate capacitance that is seen through the drain of the N-channel device. If the gate of the N-channel device is low, an inversion is not formed. For instance, in considering device N1 (neglecting parasitic capacitances), if ACAP0 is high, signal IN0 sees the gate capacitance, source capacitance, and drain capacitance of N1. But if ACAP0 is low, then signal IN0 sees only the drain capacitance of N1. Delays similarly result from P-channel devices configured as shown in FIG. 4 when their corresponding ACAPBx signals are asserted low.

Referring back to FIG. 2, the clock skew control logic blocks 205A and 205B both initially apply the default skew amount (e.g., 4 delay increments), so that each edge of the EEE CLK0 signal is delayed by the default skew relative to the EEEE CLK signal, and each edge of the COREFB signal is delayed by the same default skew relative to the CORECLK signal. If all clock edges are skewed by the same amount, the clock generator 201 maintains synchronization of frequency and duty cycle between the EEEE CLK and COREFB signals (even though the respective edges are skewed relative to each other). The clock skew control logic 205A is programmed via the SKADJ_QE signal to delay or advance selected clock edges of the EEE CLK0 signal, and thus selected clock edges of the EEE CLK1–EE CLKN signals, relative to default skew value to enable variable skew adjustment for purposes of testing and debug. The particular clock edges are selected by pulsing the SYNC_QE signal prior to and just after the selected number of edges. The clock skew control logic 205B is programmed via the SKADJ_CC signal to advance or delay corresponding clock edges of the CORECLK signal by an equal and opposite amount relative to the skew adjustment applied by the clock skew control logic 205A to compensate the skew adjustment prior to being provided back to the clock generator 201. For example, if one or more edges of the EEE CLK0 signal is advanced by two delay units, the corresponding clock edges of the COREFB signal are delayed by two delay units to compensate. Accordingly, the clock generator 201 does not see the skew that was introduced and is thus precluded from making undesirable corrections in frequency and/or phase of the EEEE CLK signal.

Figure 5:
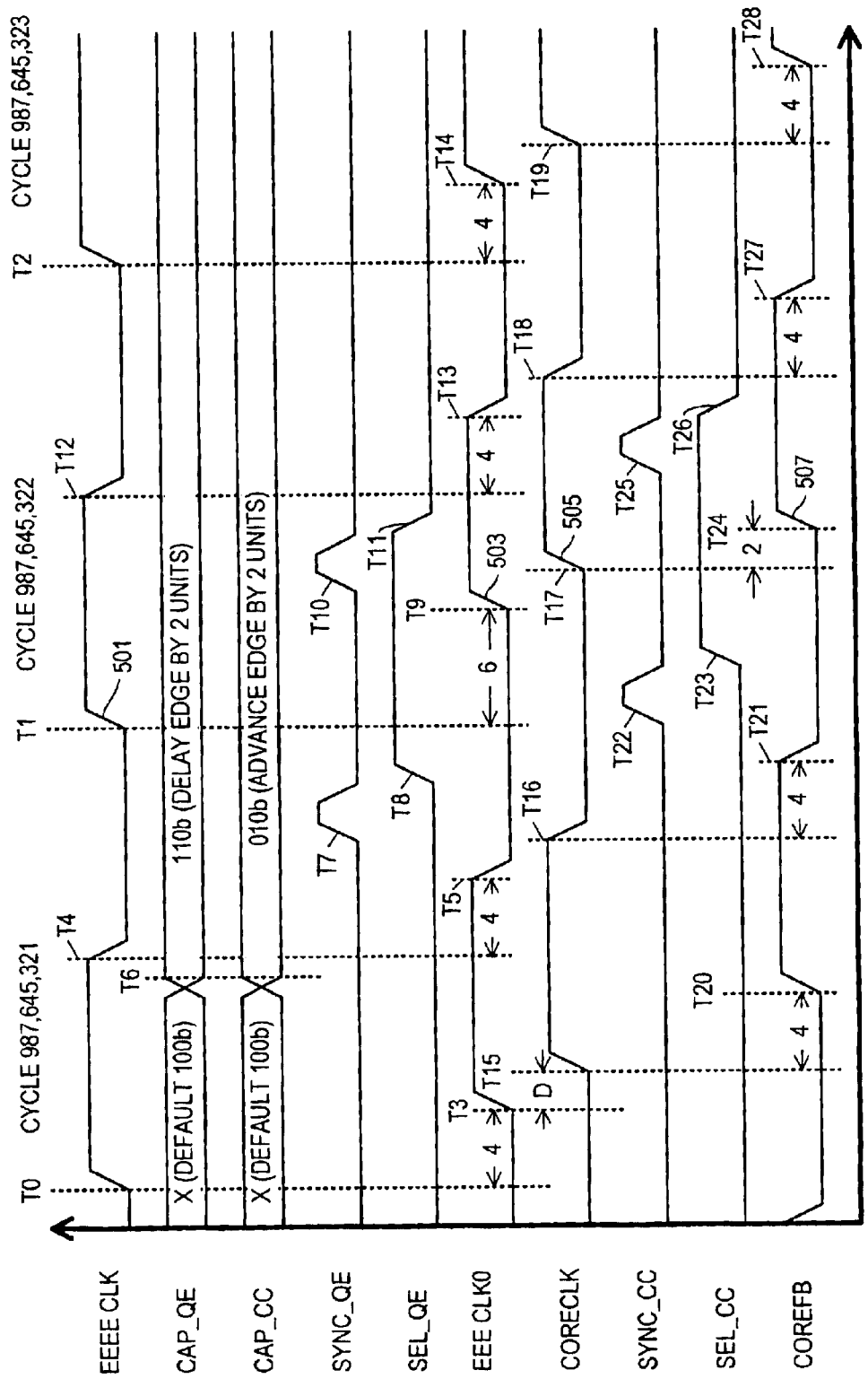
FIG. 5 is a timing diagram of selected signals of FIG. 2 illustrating delay of a selected rising edge of the EEE CLK0 signal employing clock skew control according to an embodiment of the present invention.

FIG. 5 is a timing diagram of selected signals of FIG. 2 illustrating skew of a selected rising edge of the EEE CLK0 signal employing clock skew control according to an embodiment of the present invention. The timing diagram includes traces of selected signals along the Y vertical axis versus time along the X horizontal axis. The plotted signals include the EEEE CLK signal, a set of signals CAP_QE representing the CAP[2:0]/CAPB[2:0] bits of the clock skew control logic 205A, a set of signals CAP_CC representing the CAP[2:0]/CAPB[2:0] bits of the clock skew control logic 205B, the SYNC_QE signal, a signal SEL_QE representing the SEL signal of the clock skew control block 205A, the EEE CLK0 signal (also representing the skew applied to the EEE CLK1–EEE CLKN signals, the CORECLK signal, the SYNC_CC signal, a signal SEL_CC representing the SEL signal of the clock skew control block 205B, and the COREFB signal. The relevant skew values of the CAP_QE and CAP_CC signals are shown within the plot as binary numbers or as an "X" for "don't care", in which case the default value of 100b applies. The relative skews are not necessarily shown to scale relative to the applicable frequency, and instead are scaled solely for clarity of illustration. Particular time points are shown as reference numbers beginning with the letter "T", which are arbitrarily numbered in the order discussed and not intended to indicate any particular sequence or order in time.

A particular sequential series of clock cycles of the EEEE CLK signal are shown illustrating that the present invention enables skew to be applied to any selected clock edges of choice. As shown, the particular clock cycle number 987, 645,321 is shown occurring between consecutive rising edges of EEEE CLK signal from time T0 to T1 the next cycle number 987,645,322 occurs between consecutive rising edges from time T1 to time T2, and so on. The SEL_QE signal is low during the rising edge of the EEEE CLK signal at time T0, so that the clock skew control logic 205A applies a 4 unit delay to the EEE CLK0 signal and asserts a corresponding rising edge at time T3. The subsequent falling edge of the EEEE CLK signal occurs at time T4, and the clock skew control logic 205A applies a 4 unit delay to the EEE CLK0 signal and asserts a corresponding falling edge at time T5. Meanwhile, at a time T6, the SKADJ_QE and SKADJ_CC signals are asserted to program the clock skew control logic blocks 205A and 205B to program a 2 unit delay to the EEE CLK0 signal and to advance the COREFB signal by two delay units. As shown at time T6, the CAP_QE bits are programmed to 110b and the CAP_CC bits are programmed to 010b.

The SYNC_QE signal is pulsed (asserted high then low) at time T7, which causes the SEL_QE signal to be asserted high at subsequent time T8. Since the SEL_QE signal is high during the next rising edge 501 of the EEEE CLK signal at time T1 and since the clock skew control logic 205A is programmed with an additional 2 unit delay more than the default delay of 4 units, the clock skew control logic 205A asserts the following rising edge 503 of the EEE CLK0 signal at time T9, which is 6 delay units after time T1. The SYNC_QE signal is pulsed again at subsequent time T10, which causes the SEL_QE signal to be asserted low at subsequent time T11 prior to the next falling edge of the EEEE CLK signal occurring at time T12. Thus, the clock skew control logic 205A asserts the following rising edge of the EEE CLK0 signal at time T13, which is the default 4 delay units after time T12. Since the SEL_QE signal remains low during the next rising edge of the EEEE CLK signal at time T2 beginning the next cycle number 987,645,323, the next rising edge of the EEE CLK0 signal at time T14 occurs 4 delay units after time T2.

The skewed EEE CLK0 signal is provided to and processed by the clock distribution network 207, which generates skewed clock signals EEE CLK1–EEE CLKN routed to the clock phase synchronization node 208. The clock phase synchronization node 208 returns the COREFB signal, shown as a delayed version of the EEE CLK0 signal. As shown, the CORECLK signal is delayed relative to the EEE CLK0 signal by a delay amount "D", so that the edges of the CORECLK signal occurring at times T15, T16, T17, T18 and T19, respectively, are delayed by delay amount D relative to the corresponding edges of the EEE CLK0 signal occurring at respective times T3, T5, T9, T13 and T14. Since the SEL_CC signal is low during the rising edge of the CORECLK signal at time T15, the clock skew control logic 205B asserts the following rising edge of the COREFB signal at time T20, which is 4 delay units after time T15. Also, the following falling edge of the COREFB signal occurs at time T21, which is 4 delay units after the next falling edge of the CORECLK signal at time T16.

The SYNC_CC signal is pulsed at time T22 and the SEL_CC signal is asserted high at time T23, prior to the next rising edge 505 of the CORECLK signal at time T17. Since the clock skew control logic 205B is programmed with a skew of 2 delay units representing an advance of 2 delay units relative to the default of 4 delay units, the clock skew control logic 205B asserts the next rising edge 507 of the COREFB signal at time T24, which is 2 delay units after the rising edge 505 of the CORECLK signal at time T17. The SYNC_CC signal is pulsed again at time T25 and the SEL_CC signal goes low at time T26, which is prior to the next falling edge of the CORECLK signal at time T18. Thus, the clock skew control logic 205B asserts the next falling edge of the COREFB signal at time T27, which is 4 delay units after time T18. Also, the clock skew control logic 205B asserts the next rising edge of the COREFB signal at time T28, which is 4 delay units after the next rising edge of the CORECLK signal at time T19.

The CORECLK signal is returned as a delayed version of the EEE CLK0 signal, so that the rising edge 505 of the CORECLK signal corresponding to the rising edge 503 is also skewed. The skew control logic 205B enables correction of the skewed edge 503 by advancing the edge 507 by 2 delay units relative to the default delay amount. In this manner, the CORECLK signal is compensated prior to being provided to the clock generator 201 as the COREFB signal to prevent the clock generator 201 from attempting to align frequency and phase to correct for the skewed edge 503. Instead, the amount of skew introduced into EEE CLK0 is compensated for by introducing a skew in the opposite direction in COREFB signal so that the clock generator 201 senses the default skew conditions.

In summary, each edge of the EEE CLK0 signal is skewed by a default amount relative to the EEEE CLK signal while the SEL_QE signal is low, and by a programmed skew amount while the SEL_QE signal is high. In the case illustrated in FIG. 5, the clock skew control logic 205A enables a single rising edge 503 of the EEE CLK0 to be skewed by 2 additional delay units relative to the corresponding rising edge 501 initiating clock cycle 987,645,322 of the EEEE CLK signal. The corresponding rising edge of all of the EEE CLK1–EEE CLKN signals are skewed by the same amount. Such targeted edge skewing enables the identification, isolation and analysis of timing problems of the IC 200. The IC 200 has, for example, an unanticipated critical path timing problem caused by one or more process variations so that the IC 200 does not perform at the target clock speed or does not work at all. Once the critical path timing problem is determined, the IC 200 is programmed to adjust and remove the timing problem to enable operation at the target clock speed.

Figure 6:
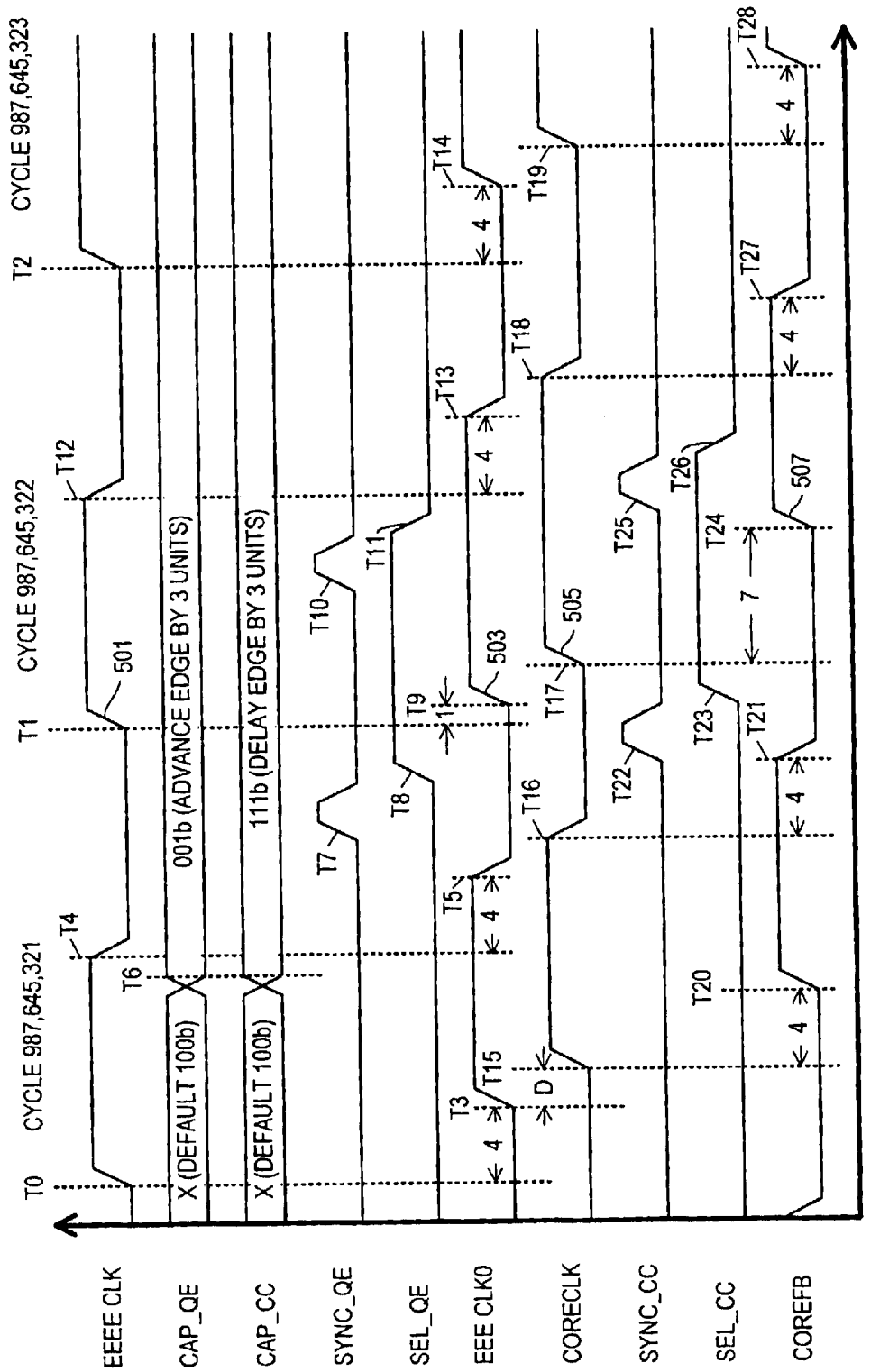
FIG. 6 is another timing diagram of selected signals of FIG. 2 illustrating advancement of a selected rising edge of the EEE CLK0 signal employing clock skew control according to an embodiment of the present invention.

FIG. 6 is another timing diagram of selected signals of FIG. 2 illustrating advancement of a selected rising edge of the EEE CLK0 signal employing clock skew control according to an embodiment of the present invention. The timing diagram of FIG. 6 is similar to FIG. 5 and includes plots of the same signals along the Y vertical axis versus time along the X horizontal axis. In this case, however, the clock skew control logic 205A is programmed to advance the rising edge 503 of the EEE CLK0 signal by 3 delay units and to delay the rising edge 507 of the COREFB signal by 3 delay units relative to the default delay amount. Operation is substantially similar to that of FIG. 5, except that the rising edge 503 at time T9 of the EEE CLK0 signal rises after only one delay unit after the rising edge 501 at time T1 of the EEEE CLK signal. Also, the rising edge 507 at time T24 of the COREFB signal is asserted 7 delay units after the rising edge 505 at time T17 of the CORECLK signal. When compared to FIG. 5, the COREFB signal provided to the clock generator 201 is the same regardless of the skew applied by the clock skew control logic 205A because of the corresponding compensation provided by the clock skew control logic 205A.

Figure 7:
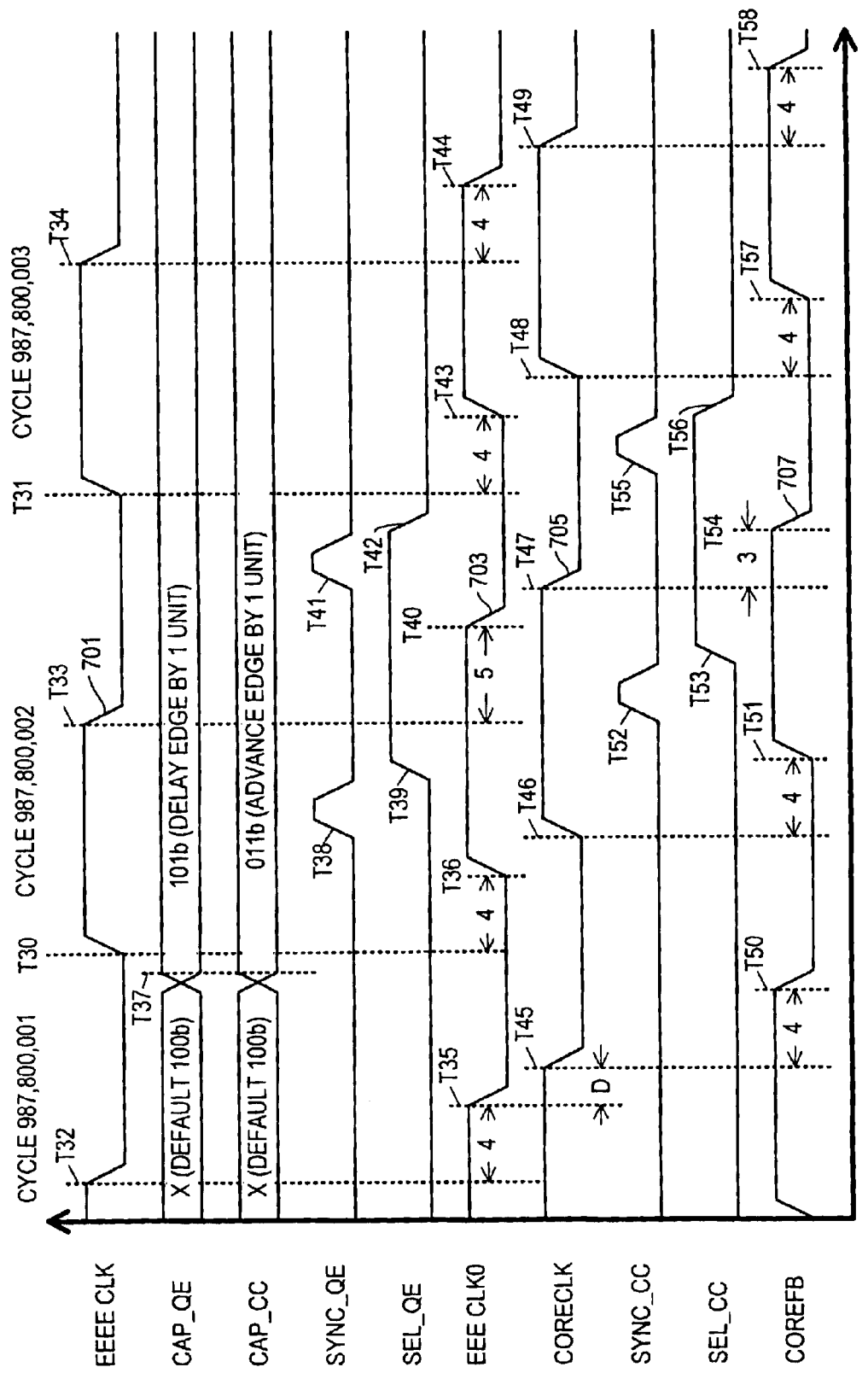
FIG. 7 is another timing diagram of selected signals of FIG. 2 illustrating delay of a selected falling edge of the EEE CLK0 signal employing clock skew control according to an embodiment of the present invention.

FIG. 7 is another timing diagram of selected signals of FIG. 2 illustrating delay of a selected falling edge of the EEE CLK0 signal employing clock skew control according to an embodiment of the present invention. The timing diagram of FIG. 7 is similar to that of FIGS. 5 and 6 and includes plots of the same signals along the Y vertical axis versus time along the X horizontal axis. In this case, however, the clock skew control logic 205A is programmed at time T37 for a one unit delay while the clock skew control logic 205A is programmed with a 1 unit advance relative to the default delay amount of 4 units. Also, the target edge is a falling edge 701 of the EEEE CLK signal at time T33 during another arbitrary clock cycle number 987,800,002. The clock cycle number 987,800,002 occurs between rising edges of the EEEE CLK signal at times T30 and T31. The prior falling edge of the EEEE CLK signal during the previous clock cycle number 987,800,001 occurs at time T32 while a subsequent falling edge of the EEEE CLK signal during the next clock cycle number 987,800,003 occurs at time T34.

The SEL_QE signal is low during clock cycle number 987,800,001 so that a falling edge of the EEE CLK0 signal occurs at time T35, which is 4 delay units after time T32. Also, the next rising edge of the EEE CLK0 signal occurs at time T36, which is 4 delay units after time T30. The SYNC_QE signal is pulsed at time T38, and the SEL_QE signal is asserted high at time T39 after time T30 and before the falling edge 701 at time T33 of the EEEE CLK signal. The next falling edge 703 of the EEE CLK0 signal is asserted by the clock skew control logic 205A at time T40, which is 5 delay units after the falling edge 701 at time T33. The SYNC_QE signal is pulsed again at time T41 and the SEL_QE signal is asserted low at time T42 prior to the next rising edge of the EEEE CLK signal at time T31. Thus, the next rising edge of the EEE CLK0 signal at time T43 occurs 4 delay units after time T31 and the subsequent falling edge of the EEE CLK0 signal at time T44 occurs 4 delay units after the next falling edge of the EEEE CLK signal time T34. In this manner, the falling edge 703 of the EEE CLK0 signal is skewed by an additional delay unit relative to the falling edge 701 of the EEEE CLK signal.

The CORECLK signal is delayed by the delay amount "D" relative to the EEE CLK0 signal as previously described, where the CORECLK signal includes consecutive edges occurring at times T45, T46, T47, T48 and T49 which correspond to consecutive edges of the EEE CLK0 signal occurring at times T35, T36, T40, T43 and T44, respectively, and to consecutive edges of the COREFB signal occurring at times T50, T51, T54, T57 and T58, respectively. The edges of the COREFB signal at times T50 and T51 occur 4 delay units after the respective edges of the CORECLK signal at times T45 and T46 while the SEL_CC signal is low. The SYNC_CC signal is pulsed at time T52 and the SEL_CC signal is asserted high at time T53 prior to the falling edge 705 of the CORECLK signal. The next falling edge 707 of the COREFB signal at time T54 occurs 3 delay units after the falling edge 705 of the CORECLK signal for compensation. The SYNC_CC signal is pulsed again at time T55 and the SEL_CC signal goes low at time T56. Thus, the next two edges of the COREFB signal at times T57 and T58 occur 4 delay units after the corresponding edges of the CORECLK signal at times T48 and T49, respectively.

In the case illustrated in FIG. 7, the clock skew control logic 205A enables a single falling edge 703 of the EEE CLK0 to be skewed by 1 additional delay unit relative to the corresponding falling edge 701 initiating clock cycle 987, 8005,002 of the EEEE CLK signal. The corresponding falling edges of all of the EEE CLK1–EEE CLKN signals are skewed by the same amount. The CORECLK signal is returned as a delayed version of the EEE CLK0 signal, so that the falling edge 705 of the CORECLK signal corresponding to the falling edge 703 is also skewed by the same amount. The skew control logic 205B enables correction of the skewed falling edge 703 by advancing the falling edge 707 by 1 delay unit relative to the default delay amount. In this manner, the CORECLK signal is compensated prior to being provided to the clock generator 201 as previously described.

Figure 8:
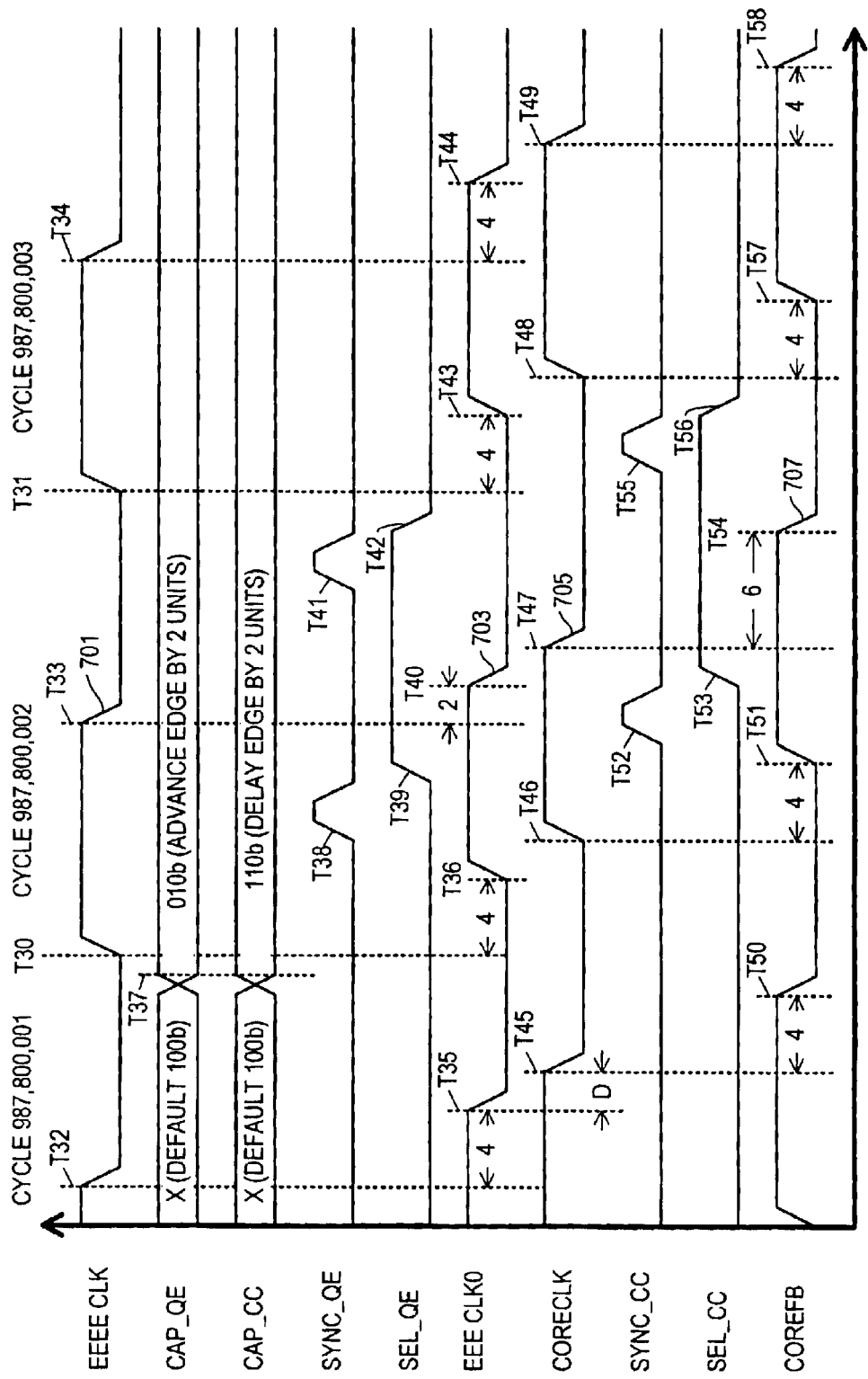
FIG. 8 is another timing diagram of selected signals of FIG. 2 illustrating advancement of a selected falling edge of the EEE CLK0 signal employing clock skew control according to an embodiment of the present invention.

FIG. 8 is another timing diagram of selected signals of FIG. 2 illustrating advancement of a selected falling edge of the EEE CLK0 signal employing clock skew control according to an embodiment of the present invention. The timing diagram of FIG. 8 is similar to FIG. 7 and includes plots of the same signals along the Y vertical axis versus time along the X horizontal axis. In this case, however, the clock skew control logic 205A is programmed to advance the falling edge 703 of the EEE CLK0 signal by 2 delay units and to delay the falling edge 707 of the COREFB signal by 2 delay units relative to the default delay amount. Operation is substantially similar to that of FIG. 7, except that the falling edge 703 at time T40 falls after only two delay units after the falling edge 701 at time T33 of the EEEE CLK signal. Also, the falling edge 707 at time T54 of the COREFB signal is asserted 6 delay units after the falling edge 705 at time T47 of the CORECLK signal. When compared to FIG. 7, the COREFB signal provided to the clock generator 201 is the same regardless of the skew applied by the clock skew control logic 205A because of the corresponding compensation provided by the clock skew control logic 205A.

Figure 9:
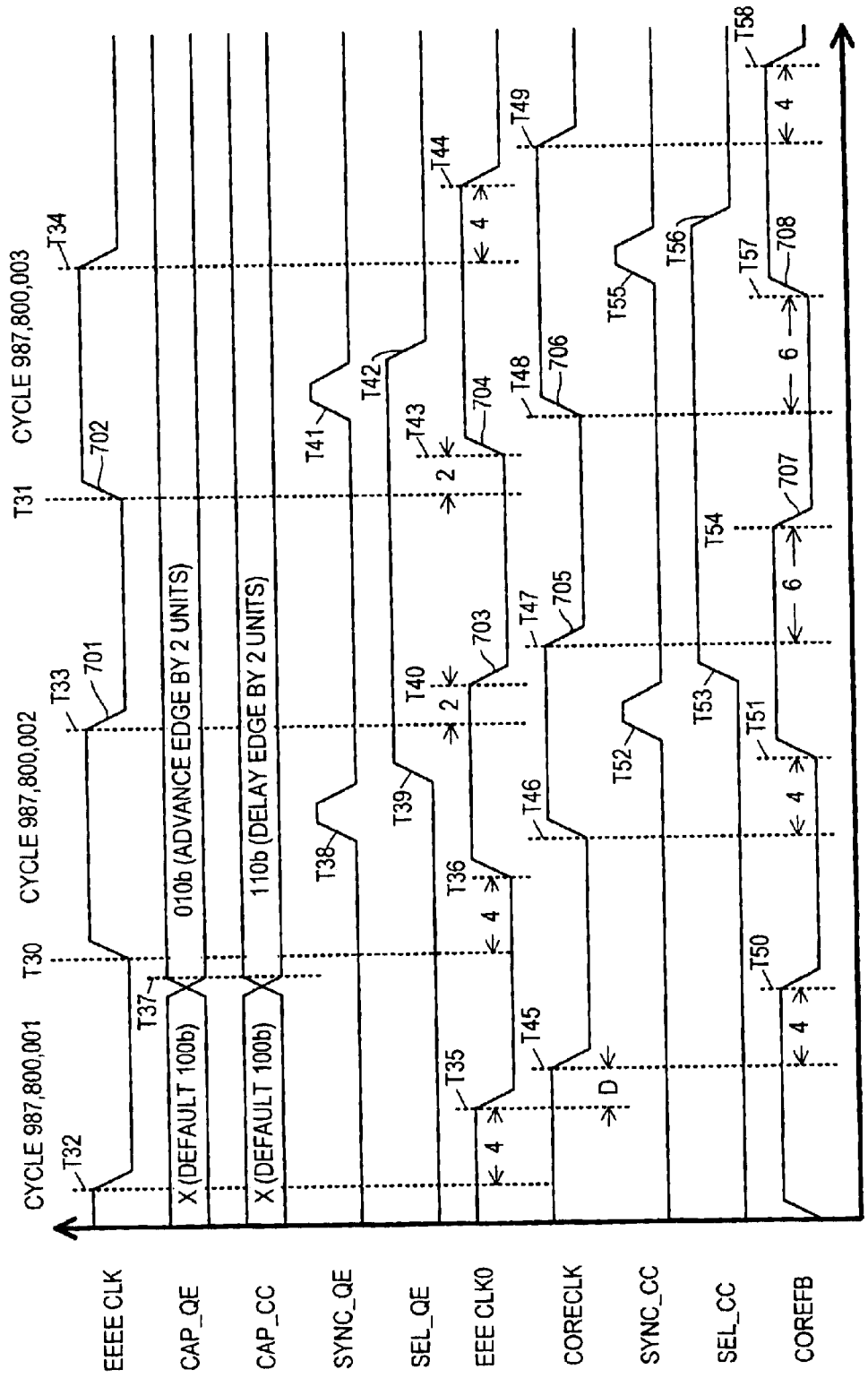
FIG. 9 is another timing diagram of selected signals of FIG. 2 illustrating advancement of two consecutive edges of the EEE CLK0 signal employing clock skew control according to an embodiment of the present invention.

FIG. 9 is another timing diagram of selected signals of FIG. 2 illustrating advancement of two consecutive edges of the EEE CLK0 signal employing clock skew control according to an embodiment of the present invention. The timing diagram of FIG. 9 is similar to FIG. 8 and includes plots of the same signals along the Y vertical axis versus time along the X horizontal axis. In this case, however, the clock skew control logic 205A is programmed to advance the falling edge 703 and the following rising edge 704 of the EEE CLK0 signal by 2 delay units and to delay the falling edge 707 and the following rising edge 708 of the COREFB signal by 2 delay units relative to the default delay.

The reset pulse of the SYNC_QE signal at time T41 occurs after the rising edge 702 of the EEEE CLK signal at time T31, so that the SEL_QE signal is high during the rising edge 702. Thus, the rising edge 704 of the EEE CLK0 signal at time T43 is also advanced by 2 delay units after the rising edge 702 of the EEEE CLK signal at time T31. The corresponding falling and rising edges 705 and 706 of the CORECLK signal at times T47 and T48, respectively, are also advanced by 2 delay units accordingly. Also, the reset pulse of the SYNC_CC signal at time T55 occurs after the rising edge 706 of the CORECLK signal at time T48, so that the SEL_CC signal is high during the rising edge 706. Thus, the corresponding rising edge 708 of the COREFB signal at time T57 is delayed by 6 delay units after the rising edge 706 of the CORECLK signal at time T48. Since the SEL_CC signal is pulled low prior to the next falling edge of the CORECLK signal at time T49, the subsequent falling edge of the COREFB signal at time T58 occurs 4 delay units after the falling edge of the CORECLK signal at time T49, so that the frequency and phase of the COREFB signal is compensated for the clock generator 201.

The timing diagrams of FIGS. 5–9 illustrate that any number of selected clock edges or any consecutive number of selected clock edges of the EEE CLK signals may be delayed or advanced through application of the clock skew control logic 205A. The clock skew control logic 205B is employed to apply equal and opposite skew values relative to a default skew value so that the applied skew is transparent to PLL operation of the clock generator 201.

Figure 10:
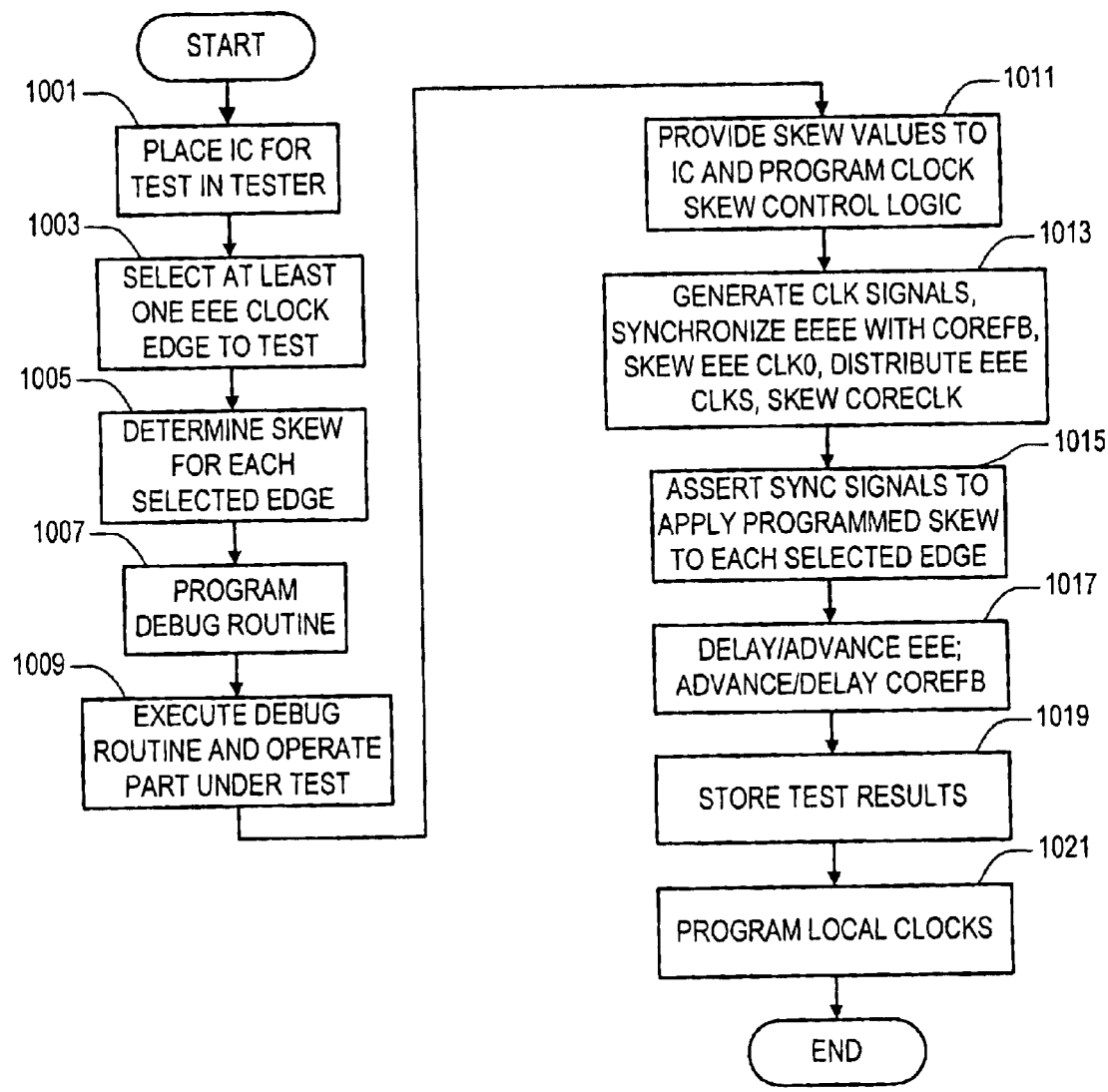
FIG. 10 is a flowchart diagram illustrating a test operation to debug timing problems of the IC of FIG. 2 according to an exemplary embodiment of the present invention.

FIG. 10 is a flowchart diagram illustrating a test operation to debug timing problems of the IC 200 according to an exemplary embodiment of the present invention. At first block 1001, the IC 200 is placed in the tester, which couples the chip tester 215 to the external test port 213. Next block 1003 illustrates that one or more edges of the EEE CLK signals are selected to be tested. At next block 1005, the desired skew amount to be applied to each selected edge is determined. As described above, different skew amounts may be applied to different clock transitions. At next block 1007, a debug routine for testing the IC 200 is programmed for testing the selected number of edges with the desired skew amount. The debug routine may be loaded into and executed from the chip tester 215 or the test logic 211 or a combination of both.

At next block 1009, the debug routine is executed and the IC 200 is operated to perform testing. It is noted that many variations and embodiments are contemplated for implementation of the debug routine and test procedure. In one embodiment, the debug routine is completely automatic so that after being started by a test technician, it runs until it completes the programmed test operation and automatically stops. In this case, the debug routine performs all of the steps necessary to initialize, execute and complete simulation and testing to test potential timing problems on the IC 200. Alternatively, the debug routine may be implemented with any desired level of interactivity. In the interactive case, a test technician cooperates interactively with the debug routine to conduct testing. For example, the debug routine may be programmed to start and stop at a selected times or in response to a predetermined trigger points, such as particular clock cycle numbers or the like. The test technician programs values during any one or more stopping points, such as skew values and new trigger points, and restarts operation.

At next block 1011, the skew values are provided to the IC 200 and the clock skew control logic is programmed. For example, the memory 309 of the phase adjust logic 301 within each of the clock skew control logic blocks 205A and 205B is programmed with the provided skew values. In one embodiment, the debug routine provides the skew values and/or programs the phase adjust logic 301 automatically during operation. Alternatively, the test technician manually provides the skew values and manually programs the phase adjust logic 301 before execution of the debug routine or during a pre-scheduled stopping point.

During operation of the IC 200, the clock control logic performs several clock functions as described in next block 1013. The clock generator 201 generates and synchronizes the primary EEEE CLK signal with the COREFB signal. The transitions or edges of the EEE CLK0 signal are skewed by the clock skew control logic 205A, which develops the EEE CLK0 signal. The EEE CLK0 signal is duplicated and distributed by the clock distribution network 207 in the form of the EEE CLK1–EEE CLKN signals, which are routed back from the clock phase synchronization node 208 as the CORECLK signal. The transitions or edges of the CORECLK signal are skewed by the clock skew control logic 205B, which develops the COREFB signal provided as the feedback signal to the clock generator.

At next block 1015, the SYNC signals, including the SYNC_QE and SYNC_CC signals, are asserted or otherwise pulsed just prior to each selected edge to be skewed. Initially, the clock skew control logic blocks 205A and 205B are in a default state in which the clock skew control logic 205A applies a default skew amount to each edge of the EEEE CLK signal and the clock skew control logic 205B applies the default skew amount to each edge of the CORE-CLK signal. As described at next block 1017, when the SYNC signals are asserted or pulsed, the programmed skew values are applied to adjust or otherwise vary corresponding edges of the EEE CLK signals and the COREFB signal. In one embodiment, the skew amount applied by the clock skew control logic 205B is an equal and opposite skew amount relative to the default skew as compared to the skew amount applied by the clock skew control logic 205A. Thus, for each edge of the EEE CLK signals that is delayed, the corresponding edge of the COREFB signal is advanced by the same amount and vice-versa. The SYNC signals are negated or otherwise asserted again to reset the clock skew control logic blocks 205A and 205B back to the default state to apply the default skew amount.

After completion of the test, the test results may be stored as indicated at next block 1019 to enable identification and analysis of timing problems in the IC 200. At next block 1021, once any timing problems are detected and isolated, any one or more local clock skews may be programmed via any suitable programming means provided on the IC 200, such as fuses or an EPROM or the like, and test operation is complete. Such technique for programming of local clock skews is disclosed and described in the related, co-pending U.S. patent application entitled "METHOD AND APPARATUS FOR FINE TUNING CLOCK SIGNALS OF AN INTEGRATED CIRCUIT, Ser. No. 10/682,352, which is incorporated herein by reference in its entirety. Such programming resolves any identified timing problems, such as setup or hold timing problems, so that the IC 200 may be rendered operative or otherwise operated at a higher target frequency.

One advantage of an integrated circuit timing debug apparatus and method according to embodiments of the present invention is that the controllable clock skew can be provided to a fabricated part in order to detect and isolate complex logic timing problems. Another advantage is that a means is provided for debugging critical path problems that have heretofore resulted in scrapped parts. A third advantage is that a technique is provided for quantitatively measuring and compensating for the effects of process variations via simple test analysis techniques (e.g., JTAG techniques) as opposed to complex techniques (e.g., electron beam analysis) that result in modifications to the layout of the chip.

Although the present invention has been described in considerable detail with reference to certain preferred versions thereof, other versions and variations are possible and contemplated. For example, additional stages or additional levels of arrayed N-channel and P-channel devices may be provided to add further delay if desired. Also, the particular operation of control signals may be modified without departing from the spirit and scope of the present invention. For example, the SYNC signals may be level-sensitive rather than pulsed. Moreover, although the present disclosure contemplates application to metal-oxide semiconductor (MOS) type devices, including complementary MOS devices and the like, such as, for example, NMOS and PMOS transistors, it may also be applied in a similar manner to analogous types of technologies and topologies, such as bipolar devices and the like.

Finally, those skilled in the art should appreciate that they can readily use the disclosed conception and specific embodiments as a basis for designing or modifying other structures for carrying out the same purposes of the present invention without departing from the spirit and scope of the invention as defined by the appended claims.

What is claimed is:

1. An integrated circuit (IC), comprising:
   a programmable clock skew logic circuit that applies a programmed skew amount to edges of a clock signal selected by a sync signal;
   an external interface; and
   test logic circuit, coupled to said programmable clock skew logic circuit and to said external interface, that enables programming of said programmed skew amount and control of said sync signal.

2. The IC of claim 1, wherein said test logic executes a debug routine that programs said programmable clock skew logic circuit and that controls said sync signal.

3. The IC of claim 1, wherein said test logic circuit enables access to said programmable clock skew logic circuit by an externally-coupled chip tester via said external interface for programming skew and for controlling said sync signal.

4. The IC of claim 1, further comprising:
   a clock generator that synchronizes a primary clock signal with a feedback clock signal;
   said programmable clock skew logic circuit including a first clock skew logic block, coupled to said clock generator, that receives a first sync signal and that skews said primary clock signal to provide a skewed primary clock signal;
   a clock distribution network that distributes a plurality of duplicates of said skewed primary clock signal on the IC;
   a clock phase synchronization node that receives said plurality of duplicates of said skewed primary clock signal and that returns a core clock signal;
   said programmable clock skew logic circuit including a second clock skew logic block, coupled to said clock generator, that receives a second sync signal and said core clock signal and that provides said feedback clock signal with compensated skew; and
   said test logic providing said first sync signal corresponding to said primary clock signal and said second sync signal corresponding to said core clock signal.

5. The IC of claim 4, wherein said first and second clock skew logic blocks each comprise:
   programmable phase adjust logic, coupled to receive a corresponding sync signal being either one of said first and second sync signals, that provides a set of delay bits indicative of said programmed skew amount; and
   a clock skew buffer, receiving said set of delay bits and an input clock signal being either one of said primary clock signal and said core clock signal, that delays said input clock signal by an amount determined by said set of delay bits.

6. The IC of claim 5, wherein said phase adjust logic includes a programmable memory for storing a programmed skew value.

7. The IC of claim 5, wherein said clock skew buffer comprises:
   a plurality of sequentially-coupled buffers having an input receiving said input clock signal, at least one intermediate node, and an output providing a skewed clock signal; and
   at least one array of P-channel and N-channel devices, each said array having a plurality of inputs receiving said set of delay bits and at least one output coupled to said at least one intermediate node.

8. The IC of claim 7, wherein each of said at least one array of P-channel and N-channel devices comprises an N-channel array including a plurality of binarily-distributed N-channel devices with floating sources having inputs receiving true delay bits from said set of delay bits and having an output coupled to said intermediate node, and a P-channel array including a plurality of binarily-distributed P-channel devices with floating sources having a plurality of inputs receiving complementary delay bits from said set of delay bits and having an output coupled to said intermediate node.

9. The IC of claim 5, wherein said first and second clock skew logic blocks each further comprise:
   said set of delay bits comprising a first set of delay bits and said clock skew buffer comprising a first clock skew buffer that receives said first set of delay bits and that provides a first skewed clock signal;
   said phase adjust logic providing a second set of delay bits indicative of a default skew value and a select signal controlled by said corresponding sync signal;
   a second clock skew buffer, receiving said input clock signal and said second set of delay bits, that delays said input clock signal by a default skew amount determined by said second set of delay bits and that provides a second skewed clock signal; and
   select logic having a first input receiving said first skewed clock signal, a second input receiving said second skewed clock signal, a select input receiving said select signal, and an output providing a selected skewed clock signal.

10. The IC of claim 9, wherein:
    said phase adjust logic of said first clock skew logic block is programmed with a first skew value; and
    said phase adjust logic of said second clock skew logic block is programmed with a second skew value to provide an equal and opposite skew amount of said first skew value relative to said default skew amount.

11. A debug system for varying clock skew of an integrated circuit (IC) for a controllable number of clock cycles, the IC having an external test port, said debug system comprising:
    clock control logic integrated on the IC, comprising:
       a delay block that delays a selected number of transitions of a first clock signal to provide a second clock signal, wherein each selected transition of said second clock signal is delayed, based on a first sync signal, by either one of a default skew amount and a selected skew amount; and
       a test logic circuit, coupled to said delay block and accessible via the external test port, that enables dynamic control of said first sync signal and dynamic programming of said selected skew amount; and
    a chip tester, coupled to said test logic circuit via the external test port, that provides said selected skew amount and that controls said first sync signal.

12. The debug system of claim 11, wherein said test logic circuit comprises JTAG logic and wherein said external port comprises a JTAG port.

13. The debug system of claim 11, wherein said test logic circuit executes a test routine downloaded from said chip tester that provides said selected skew amount and that controls said first sync signal.

14. The debug system of claim 11, wherein said chip tester executes a test routine that provides said selected skew amount and that controls said first sync signal via said test logic circuit.

15. The debug system of claim 11, wherein said clock control logic further comprises:
- a clock generator that synchronizes said first clock signal with a feedback clock signal;
- a clock distribution network that distributes at least one third clock signal based on said second clock signal;
- a clock phase synchronization node that receives said at least one third clock signal and that returns a core clock signal;
- a compensation delay block that delays transitions of said core clock signal corresponding to said selected transitions of said first clock signal to provide said feedback clock signal, wherein each selected transition of said core clock signal is delayed, as determined by a second sync signal, by either one of said default skew amount and a compensated skew amount; and
- said test logic circuit providing said first sync signal corresponding to said first clock signal and said second sync signal corresponding to said core clock signal.

16. The system of claim 15, wherein said compensated skew amount is an opposite differential of said selected skew amount relative to said default skew amount.

17. A method of debugging an integrated circuit (IC) by adjusting skew of a primary clock signal for a controllable number of clock cycles, comprising:
- providing at least one skew value to the IC;
- selecting at least one edge of the primary clock signal;
- delaying a selected number of edges of the primary clock signal according to the at least one skew value; and
- executing a debug routine that provides the at least one skew value and that controls assertion of at least one sync signal to select edges of the primary clock signal.

18. The method of claim 17, further comprising programming an on-chip test logic circuit with said debug routine.

19. The method of claim 17, further comprising:
- coupling an external chip tester to the IC via a test interface coupled to the on-chip test logic circuit; and
- said executing a debug routine comprising executing said debug routine on the chip tester to control the IC.

20. The method of claim 17, further comprising:
- said delaying a selected number of edges of the primary clock signal comprising advancing or delaying selected edges relative to a default skew amount;
- synchronizing the primary clock signal with a feedback clock signal;
- distributing a plurality of skewed primary clock signals on the IC to a clock phase synchronization node, which returns a core clock signal; and
- compensating skew of edges of the core clock signal corresponding to the selected edges of primary clock signal relative to the default skew amount to provide the feedback clock signal.

21. The method of claim 20, further comprising delaying non-selected edges of the primary clock signal and non-corresponding edges of the core clock signal by the default skew amount.

22. The method of claim 20, wherein said compensating skew of edges of the core clock signal comprises adjusting the edges by an equal and opposite amount relative to the default skew amount.

23. The method of claim 20, further comprising:
- said providing at least one skew value to the IC comprising programming a first skew value and a second skew value on the IC;
- said delaying a selected number of edges of the primary clock signal comprising delaying edges by a skew amount based on the first skew value; and
- said compensating skew comprising delaying edges by a skew amount based on the second skew value.

24. The method of claim 23, wherein said compensating skew comprises phase adjusting the first and second skew values to provide equal and opposite skew amounts relative to the default skew amount.

* * * * *